United States Patent
Takahashi et al.

(10) Patent No.: US 6,575,352 B2
(45) Date of Patent: Jun. 10, 2003

(54) APPARATUS AND METHOD FOR SOLDERING ELECTRONIC COMPONENTS TO PRINTED CIRCUIT BOARDS

(75) Inventors: Kazushi Takahashi, Tokyo (JP); Hiroshi Ohuchi, Tokyo (JP)

(73) Assignee: Senju Metal Industry, Co., Ltd., Tokyo (JP)

( * ) Notice: Subject to any disclaimer, the term of this patent is extended or adjusted under 35 U.S.C. 154(b) by 0 days.

(21) Appl. No.: 09/910,905

(22) Filed: Jul. 24, 2001

(65) Prior Publication Data

US 2002/0011511 A1 Jan. 31, 2002

(30) Foreign Application Priority Data

Jul. 24, 2000 (JP) ........................................ 2000-222565

(51) Int. Cl.[7] ................................................ B23K 1/20
(52) U.S. Cl. ........................................ 228/223; 228/37
(58) Field of Search ......................... 228/179.1, 180.21, 228/234.1, 260, 37, 175; 219/679

(56) References Cited

U.S. PATENT DOCUMENTS

| | | | |
|---|---|---|---|
| 4,402,448 A | * | 9/1983 | O'Rourke .................. 228/125 |
| 4,600,137 A | * | 7/1986 | Comerford .................. 228/102 |
| 6,168,065 B1 | * | 1/2001 | Willemen .................. 228/20.1 |
| 6,204,490 B1 | * | 3/2001 | Soga et al. .................. 148/400 |
| 6,340,110 B1 | * | 1/2002 | Nakamura et al. ....... 228/179.1 |

* cited by examiner

Primary Examiner—Tom Dunn
Assistant Examiner—Jonathan Johnson
(74) Attorney, Agent, or Firm—Wenderoth, Lind & Ponack, L.L.P.

(57) ABSTRACT

An automated soldering apparatus includes a conveyor for transporting a printed circuit board along a predetermined path, a fluxer located below the conveyor for coating the circuit board and the electronic components with flux, and a preheater located downstream of the fluxer for heating the circuit board and the electronic components to a predetermined temperature. A molten solder bath is provided downstream of the preheater for applying a molten solder to selected areas of the circuit board. A cooling assembly is arranged downstream of and adjacent to the molten solder bath. The cooling assembly is operable to cool the applied molten solder at a rate of approximately as high as 1.0° C. per second until the molten solder reaches its solidus temperature.

14 Claims, 4 Drawing Sheets

APPARATUS AND METHOD FOR SOLDERING ELECTRONIC COMPONENTS TO PRINTED CIRCUIT BOARDS

BACKGROUND OF THE INVENTION

The present invention relates to an apparatus and method for soldering electronic components to printed circuit boards.

Soldering of various electronic components are accomplished, for example, by dip soldering and reflow soldering. In the solder dip process, the leads of discrete components such as resistors and capacitors are inserted into holes in a printed circuit board, or surface mount components are glued onto one side of the printed circuit board with their leads contacted with pads. The board and the components are coated with flux. The flux operation is followed by a preheating operation wherein the flux coating is dried, and the board is preheated. The board and the electronic components are thereafter dipped into a molten solder bath to apply a molten solder to selected areas of the printed circuit board. The applied molten solder is cooled to solidify, thereby forming a solder joint. In the reflow soldering, a solder paste is applied to selected areas of a printed circuit board. The solder paste is typically composed of solder particles mixed with flux, adhesives, binders and other components. Surface mount components such as quad flat packs, small outline integrated circuits, capacitors and chip resistors are pressed against the applied solder paste. The adhesives hold the surface mount components to the printed circuit board. The printed circuit board is preheated in a preheat zone of a reflow solder oven. The printed circuit board is then passed through a reflow zone. This causes the solder particles in the solder paste to melt. The printed circuit board is finally transported to a cool down zone wherein the molten solder is cooled to solidify, thereby forming a solder joint.

In either process, fans are provided to rapidly cool the applied molten solder and solder paste, for example, at a rate of approximately 3.0° C. or higher per second. In some cases, the cooling rate is even higher than 10° C. per second in order to prevent the occurrence of "lift-off" of a thin film of copper from a printed circuit board.

One very common type of solder composition used in electronics fabrication is a tin/lead alloy. The tin/lead alloy, being eutectic, has a melting point of approximately 183° C. The temperature of the molten solder bath and the reflow solder oven are in a range of between approximately 220° C. and 230° C. Within this temperature range, printed circuit boards and electronic components are substantially free from thermal shock. The tinaead alloy has been selected and preferred because of superior wetting characteristics. The tin/lead alloy also yields highly reliable solder connections. However, the use of the tin/lead alloy in the fabrication of printed circuit boards is becoming more and more problematic due to the toxic effects of lead exposure to workers and the inevitable generation of hazardous waste. Thus, there is a great need to limit the amount of lead entering into the environment.

Compositions containing bismuth and indium are attempted as substitutes for the tinaead alloy. Such compositions can have a significantly low melting point, but are likely to cause discontinuities or fractures in solder connections on printed circuit boards. Other substitute compositions typically contain silver, copper, zinc, nickel, chromium, molybdenum, iron, cobalt, phosphorus, germanium and/or gallium. All of these compositions have relatively high melting points as low as 200° C., for example. Thus, the use of any of these compositions results in a significant increase in the temperatures of a molten solder bath, for example, as low as 250° C., and a reflow oven, for example, as low as 240° C. The time of exposure of printed circuit boards to such elevated temperatures must be avoided to prevent thermal shock to the boards. For this reason, applied molten solder and solder paste are conventionally cooled at a rate of at least 3.0° C. per second.

Where the molten solder is rapidly cooled, a portion of the molten solder which solidifies in an early stage is not subject to a change in volume. On the other hand, a portion of the molten solder which solidifies in a final stage is subject to substantial contraction. This results in the formation of cavities and other defects in solder connections. Also, when the printed circuit board is rapidly cooled, there arises a difference in temperature between the outer surface of the electronic components and the inside of the electronic components. The surface of the electronic components are thus subject to contraction. This contraction creates fractures and cracks in solder connections.

Accordingly, it is an object of the present invention to provide an apparatus and method for soldering electronic components to printed circuit boards which prevents the occurrence of fractures and cavities in solder connections and damage to electronic components to be soldered.

SUMMARY OF THE INVENTION

According to one aspect of the present invention, there is provided an apparatus for soldering electronic components to a substrate which comprises a conveyor for transporting the substrate along a predetermined path, a fluxer located below the conveyor for coating the substrate and the electronic components with a flux, a preheater located below the conveyor and downstream of the fluxer for heating the substrate and the electronic components to a predetermined temperature, a supply of molten solder located below the conveyor and downstream of the preheater for applying a molten solder to selected areas of the substrate, and a cooling assembly arranged downstream of and adjacent to the supply of molten solder. The cooling assembly is operable to gradually cool the applied molten solder at a rate of less than or equal to approximately 1.0° C. per second until the molten solder reaches its solidus temperature.

In a preferred embodiment, the cooling assembly may comprise at least one infrared heating element for directing heated air over the substrate, a housing within which the infrared heating element is arranged, and a porous metal plate mounted on the open top of the housing and contacted with the infrared heating element. The porous metal plate may be provided at its top surface with a ceramic layer. Preferably, a shroud may be communicated with the housing and include a fan for drawing ambient air into the shroud and feeding the air to the housing. This arrangement enables hot air to be circulated continuously through the cooling assembly.

As an alternative, the cooling assembly may comprise a plurality of infrared heating elements arranged within a housing and adapted to apply infrared heat over the substrate. Still alternatively, the cooling assembly may comprise an elongated enclosure extending upstream toward the fluxer and terminating at one end of the preheater adjacent to the fluxer. The enclosure may be shaped to define a space over the preheater, where the supply of molten solder and the cooling assembly are to confine heat dissipated from the preheater and the supply of molten solder within the space.

According to another aspect of the present invention, there is provided a reflow solder oven for soldering electronic components to a substrate, which comprises a conveyor for transporting the substrate along a predetermined path, a preheat zone for heating the substrate to which a solder paste is applied, a reflow zone located adjacent to and downstream of the preheat zone for melting solder particles in the solder paste, and a cool down zone adjacent to and downstream of the reflow zone for cooling the melted solder particles at a rate of less than or equal to approximately 1.0° C. per second until the melted solder particles reach their solidus temperature.

In a preferred embodiment, the cool down zone may comprise a pair of top and bottom heater assemblies for directing heated air over the substrate.

According to a further aspect of the present invention, there is provided a method for soldering electronic components to a substrate, which comprises transporting the substrate along a predetermined. path, coating the substrate and the electronic components with a flux, preheating the substrate and the electronic components to a predetermined temperature, applying a molten solder to selected areas of the substrate, and gradually cooling the applied molten solder at a rate of less than or equal to approximately 1.0° C. per second until the molten solder reaches its solidus temperature.

In a preferred embodiment, heated air may be directed over the substrate to cool the molten solder. Alternatively, infrared radiation may be applied to the substrate to cool the molten solder.

According to a still further aspect of the present invention, there is provided a method of soldering electronic components to a substrate, which comprises applying a solder paste to selected areas of the substrate, transporting the substrate along a predetermined path, preheating the substrate to a predetermined temperature, melting solder particles in the solder paste, and gradually cooling the melted solder particles at a rate of less than of equal to approximately 1.0° C. per second until the melted solder particles reach their solidus temperature.

The above and other objects, features and advantages of the present invention will be apparent from the following detailed description of the preferred embodiments of the invention, as illustrated in the accompanying drawings.

DETAILED DESCRIPTION OF THE INVENTION

Figure 1:
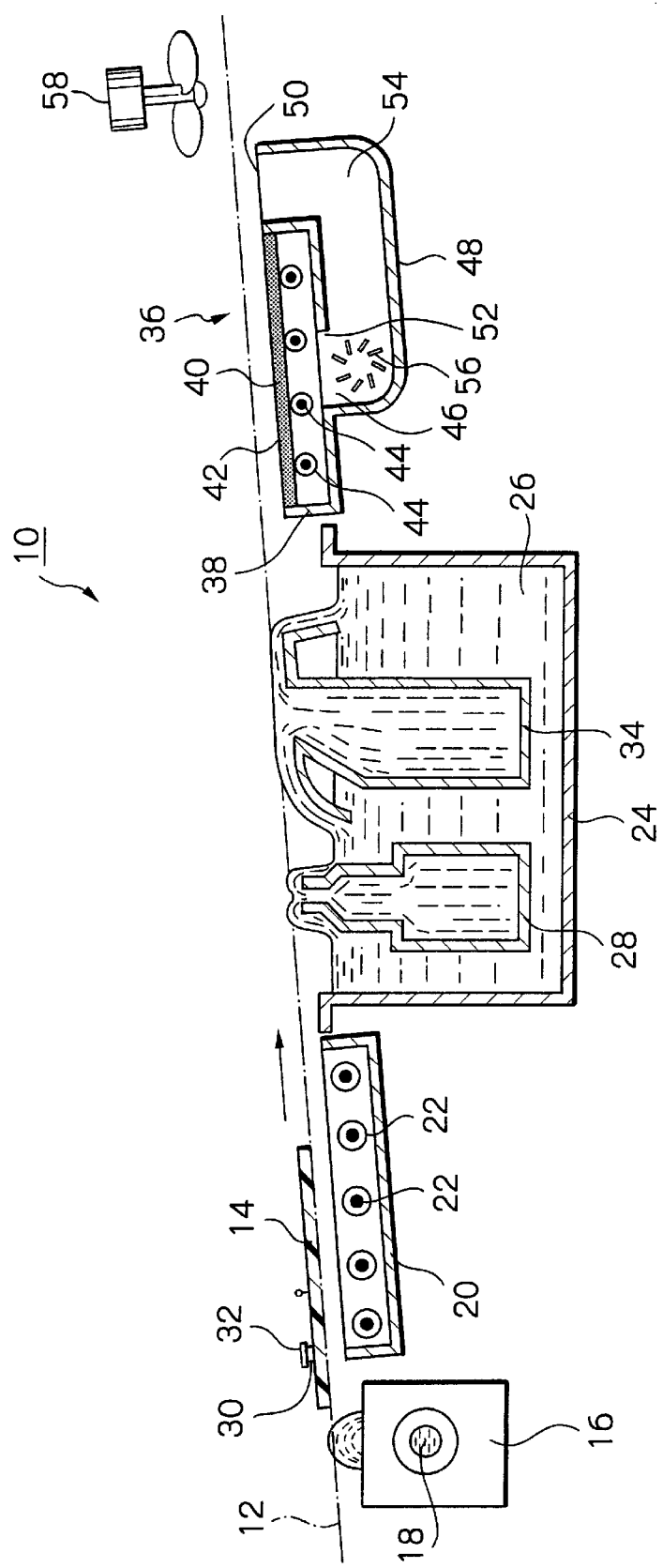
FIG. 1 is a sectional side elevation of a wave soldering apparatus according to one embodiment of the present invention that is provided with a cooling assembly for gradually cooling down a printed circuit board.

Throughout several views of the drawing, like elements are given like reference numerals.

Referring now to FIG. 1, there is illustrated a wave soldering apparatus according to one embodiment of the present invention and generally designated at 10. The soldering apparatus 10 includes a pair of endless chain conveyors 12 sloped upwards at an angle of, for example, 3 to 5 degrees to the horizontal and having a plurality of gripping fingers (not shown) to support a printed circuit board 14 thereon. The conveyors 12 are driven to advance the printed circuit board 14 at a constant speed from the entrance end to the exit end of the apparatus 10. A fluxer 16 is located adjacent to the entrance end of the apparatus 10 and below the conveyors 12. The fluxer 16 includes a foam generator 18 to apply a foam of flux uniformly to the underside of the printed circuit board 14 while the printed circuit board 14 is carried over the fluxer 16. A preheater 20 is located below the conveyors 12 and downstream of the fluxer 16 and includes a plurality of infrared heating elements 22. The infrared heating elements 22 preheat the printed circuit board 14 to approximately 110° C. to 130° C. in order to evaporate excess flux solvent, activate the flux, and minimize thermal shock to the printed circuit board.

A molten solder bath 24 is arranged below the conveyors 12 and downstream of the preheater 20 and holds a supply of molten solder 26 at a constant temperature. A relatively narrow nozzle 28 is placed in the solder bath 24 to produce a turbulent wave. This turbulent wave enables the molten solder to fill the gap between leads 30 of electronic components 32 and through holes (not shown) in the printed circuit board 14. A relatively wide nozzle 34 is placed downstream of the narrow nozzle 28 to produce a smooth, turbulent free solder wave. The smooth, turbulent free solder wave serves to remove bridges, icicles and other solder deposits which may be formed when the printed circuit board 14 passes through the turbulent wave. The relatively narrow nozzle 28, the relatively wide nozzle 34, and the molter solder bath 24 combine to form a molten solder having a solidus temperature to selected areas of the substrate 14.

A cooling assembly 36 is arranged downstream of the molten solder bath 24 and below the conveyors 12. The cooling assembly 36 includes a housing 38, and a porous metal plate 40 mounted on the top of the housing 38 and provided on its top with a ceramic layer 42. A plurality of electric heating elements 44 are arranged within the housing 38 and contacted with the underside of the porous metal plate 40. The housing 38 has an opening 46 at its bottom. A shroud 48 is connected to the housing 38 and has an inlet 50 and an outlet 52 connected to the inlet 50 through a passage 54. The outlet 52 of the shroud 48 is communicated with the opening 46 of the housing 38. A cross-flow fan 56 is mounted within the shroud 48 and located adjacent to the outlet 52. The electric heating elements 44 are energized to heat the porous metal plate 40 together with the ceramic layer 42. The ceramic layer 42, when heated, provides far-infrared radiation to uniformly heat the printed circuit board 14. The cross-flow fan 56 is then driven to draw ambient air into the shroud 48 through the inlet 50. The incoming air is forced to flow through the passage 54 and into the housing 38 through the outlet 52. The air is heated as it flows upwardly through the porous metal plate 40. The heated air is then directed over the printed circuit board 14 so as to gradually cool down the printed circuit board 14 at a rate of approximately 1° C. or lower per second until the molten solder as applied reaches its solidus temperature. Advantageously, this heated air is caused to flow toward the inlet 50 of the shroud 48 after it impinges against the printed circuit board 14. The heated air is again directed into the shroud 48, and then, into the housing 38. This results in less dissipation of heat and thus, savings in energy consumption.

An additional cooling unit in the form of a fan 58 is provided above the conveyors 12 and downstream of the cooling assembly 36. After solder joints are formed between the electronic components 32 and the printed circuit board 14 is cooled to solidify in the cooling assembly 36, the fan 58 is activated to further cool down the printed circuit board 14 to the extent that an operator will not burn his hands.

In use, the conveyors 12 are driven to continuously advance the printed circuit board 14 through the apparatus 10 at a rate of, for example, approximately 1.3 meters per minute. The leads 30 of the leaded components 32 are inserted into holes (not shown) of the printed circuit board 14. The printed circuit board 14 and the electronic components 32 are coated with flux by the fluxer 16. After this coating, the preheater 20 is energized to heat the printed circuit board 14 to approximately 130° C. The printed circuit board 14 is then moved over two solder waves produced in the molten solder bath 24 so as to solder the leads 30 to contact pads (not shown) surrounding the holes of the printed circuit board 14 and to form protective solder coatings on conductor paths of the printed circuit board 14. In this example, the solder contains 3% silver, 0.5% copper with the remainder being tin and has a melting point of approximately 217° C. Subsequent to the soldering, the printed circuit board 14 is moved over the cooling assembly 36 wherein heated air is directed over the underside of the printed circuit board 14 to gradually cool the printed circuit board 14 at a rate of, for example, 0.5° C. per second. The applied molten solder solidifies when the printed circuit board 14 reaches the downstream end of the cooling assembly 36. Finally, the fan 58 is driven to further cool down the printed circuit board 14 at a rate of approximately 5° C. per second.

Figure 2:
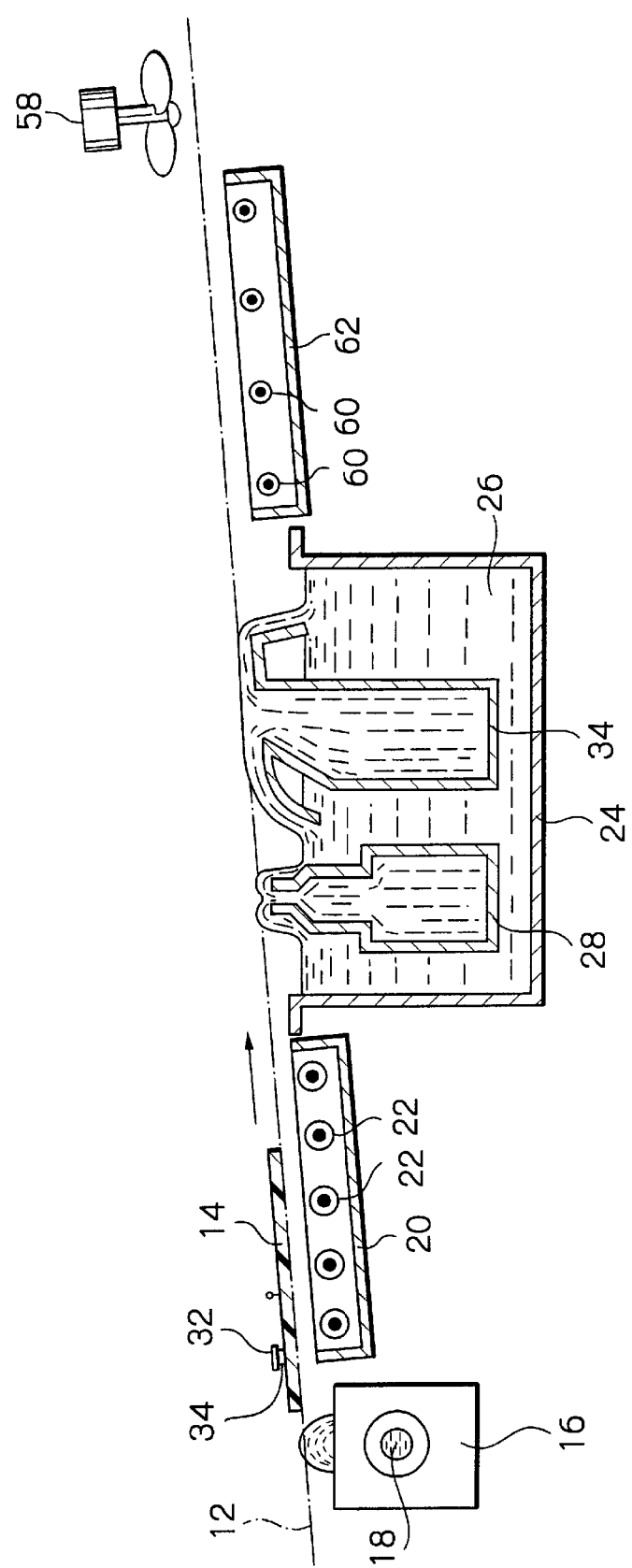
FIG. 2 is a sectional side elevation of a wave soldering apparatus with a modified form of the cooling assembly shown in FIG. 1.

As shown in FIG. 2, the cooling assembly may have a plurality of infrared heating elements 60 mounted within a housing 62 and equally spaced in the direction of travel of the printed circuit board 14. The infrared heating elements 60 are energized to provide infrared heating over the underside of the printed circuit board 14 so as to gradually cool down the printed circuit board 14 at a rate of less than or equal to approximately 1.0° C. per second until the molten solder as applied reaches its solidus temperature.

Figure 3:
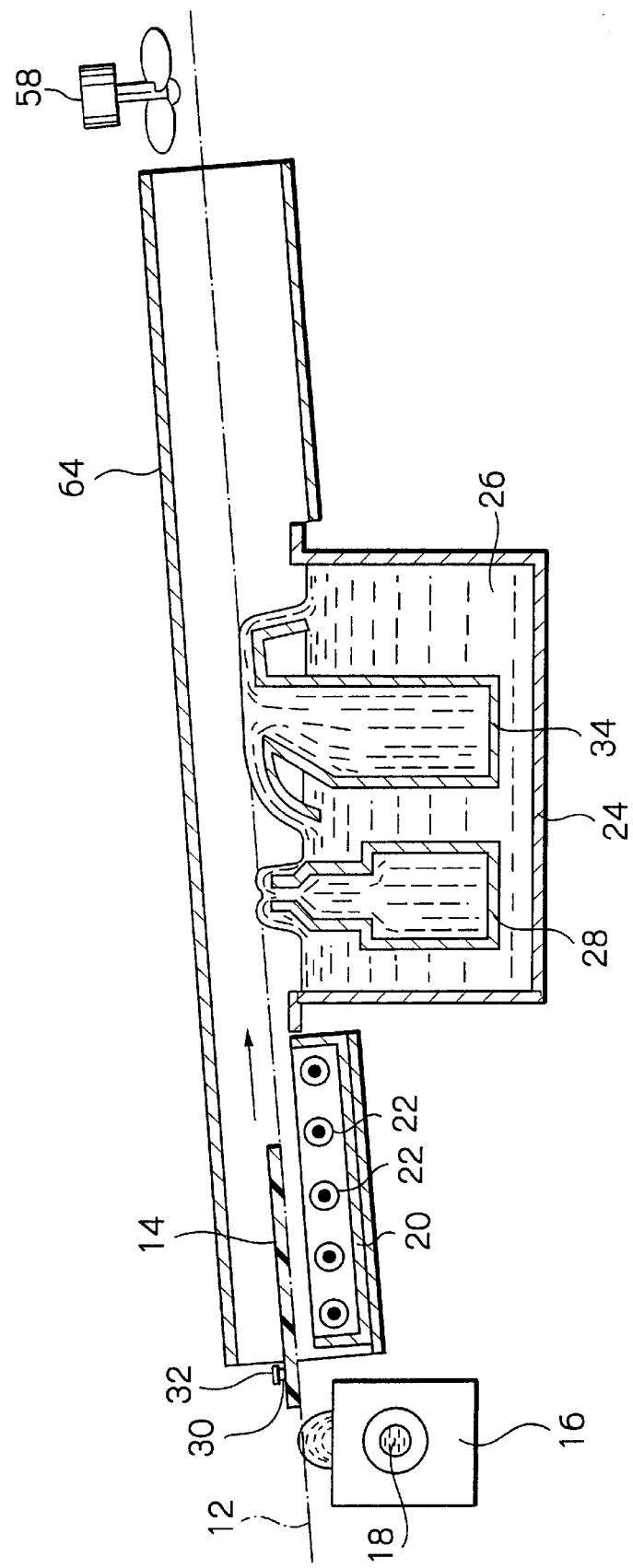
FIG. 3 is a sectional side elevation of a wave soldering apparatus with another modified form of the cooling assembly shown in FIG. 1.

Alternatively, the cooling assembly may have an elongated enclosure 64 as shown in FIG. 3. The enclosure 64 may extend from the upstream end of the preheater 20 and terminate slightly upwardly of the fan 58. Advantageously, heat dissipated from the preheater 20 and the molten solder bath 24 may be confined within the enclosure 64. This heat may be used to gradually cool down the printed circuit board at a rate of less than or equal to approximately 1.0° C. per second as in the previous embodiments.

Figure 4:
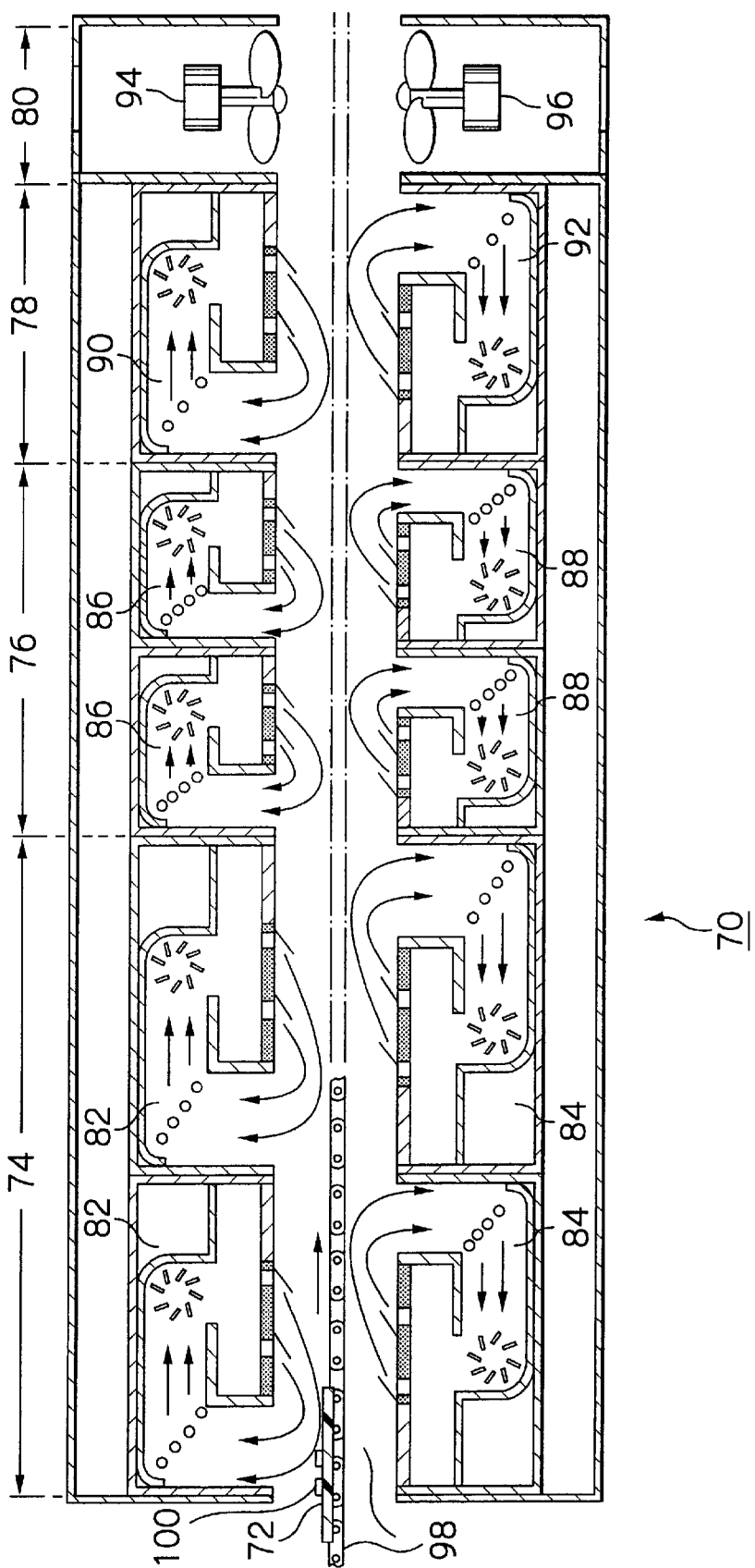
FIG. 4 is a sectional side elevation of a reflow solder oven according to another embodiment of the present invention.

Referring now to FIG. 4, there is illustrated a reflow solder oven according to another embodiment of the present invention and generally designated at 70. In the illustrated embodiment, the reflow solder oven 70 is composed of four different zones arranged in a juxtaposed relationship in the direction of travel of a printed circuit board 72. These zones include, from the upstream end of the oven 70, a preheat zone 74, a reflow zone 76, a cool down zone 78, and an additional cooling zone 80. The preheat zone 74 includes two pairs of top and bottom heater assemblies 82 and 84 to direct heated air over both sides of the printed circuit board 72. Similarly, the reflow zone 76 includes two pairs of top and bottom heater assemblies 86 and 88 to direct heated air over both sides of the printed circuit board 72. Also, the cool down zone 78 includes a single pair of top and bottom heater assemblies 90 and 92. All of these heat assemblies are similar in structure and function to that shown in FIG. 1 and will not be described herein. The additional cooling zone 80 includes a pair of top and bottom fans 94 and 96. A conveyor system 98 extends through the reflow solder oven and is located between the top and bottom heater assemblies of the respective zones.

In use, a solder paste (not shown) is applied to selected areas of the printed circuit board 72. The solder paste contains, for example, 3% silver, 0.5% copper with the remainder being tin and has a melting point of 217° C. Ceramic surface mount components 100 are pressed against the solder paste. The conveyor system 98 is driven to move the printed circuit board 72 through the reflow solder oven 70 at a rate of approximately 1.5 meters per minute. In the preheat zone 74, the top and bottom heater assemblies 82 and 84 are energized to heat the printed circuit board 72 to approximately 150° C. Following this preheating, the printed circuit board 72 is heated to approximately 250° C. in the reflow zone 76 to reflow the solder paste. The printed circuit board 72 is then moved into the cool down zone 78 wherein the top and bottom heater assemblies 86 and 88 are energized to gradually cool down the printed circuit board 72 at a rate of less than or equal to approximately 1.0° C. per second until the applied solder reaches its solidus temperature.

The present invention has been described and illustrated with respect to its preferred embodiments. However, it is to be understood that various modifications and changes may be made without departing from the spirit and scope of the invention, as defined in the appended claims.

What is claimed is:

1. An apparatus for soldering electronic components to a substrate, said apparatus comprising:
   a conveyor for transporting the substrate along a predetermined path;
   a fluxer for coating the substrate and the electronic components with a flux, said fluxer being located below said conveyor;
   a preheater for heating the substrate and the electronic components to a predetermined temperature, said preheater being located below said conveyor and downstream of said fluxer;
   a molten solder station for applying a molten solder having a solidus temperature to selected areas of the substrate, said molten solder station being located below said conveyor and downstream of said preheater; and
   a cooling assembly comprising a housing having an open top, a porous metal plate mounted on the open top of said housing and having top and bottom surfaces, a ceramic layer attached to the top surface of said porous metal plate, and at least one infrared heating element mounted within said housing and substantially contacting the bottom surface of said porous metal plate,
   wherein said at least one infrared heating element being operable to direct heated air over the substrate, said cooling assembly being arranged downstream of and adjacent to said molten solder station and being operable to cool the applied molten solder at a rate of less than or equal to approximately 1.0° C. per second until the molten solder reaches its solidus temperature.

2. The apparatus as claimed in claim 1, wherein said preheater comprises at least one infrared heating element for preheating the substrate and the electronic components to a predetermined temperature.

3. The apparatus as claimed in claim 1, wherein said cooling assembly comprises a plurality of infrared heating elements arranged within said housing and adapted to apply infrared heat over the substrate.

4. The apparatus as claimed in claim 1, wherein said cooling assembly further rises a shroud communicated with said housing and a fan for drawing ambient air into said shroud and feeding the air to said housing.

5. The apparatus as claimed in claim 1, wherein said molten solder station comprises a molten solder bath for containing a supply of molten solder that is applied to selected areas of the substrate.

6. The apparatus as claimed in claim 5, wherein said molten solder station further comprises at least one nozzle for applying molte older to selected areas of the substrate.

7. The apparatus as claimed in claim 5, wherein said molten solder station further comprises a narrow nozzle for producing a turbulent wave of molten solder and a wide nozzle for producing a turbulent free wave of molten solder.

8. An apparatus for soldering electronic components to a substrate, said apparatus comprising:

a conveyor for transporting the substrate along a predetermined path;

a fluxer for coating the substrate and the electronic components with a flux, said fluxer being located below said conveyor;

a preheater for heating the substrate and the electronic components to a predetermined temperature, said preheater being located below said conveyor and downstream of said fluxer;

a molten solder station for applying a molten solder having a solidus temperature to selected areas of the substrate, said molten solder station being located below said conveyor and downstream of said preheater; and a cooling assembly, arranged downstream of and adjacent to said molten solder station, comprising an elongated enclosure extending upstream toward said fluxer and terminating at one end of said preheater adjacent to said fluxer, said enclosure being shaped so as to define a space over said preheater, said molten solder station and said cooling assembly thereby confining heat dissipated from said preheater and said molten solder station within said space, wherein said cooling assembly is operable to cool the applied molten solder at a rate of less than or equal to approximately 1.0° C. per second until the molten solder reaches its solidus temperature.

9. The apparatus as claimed in claim 8, wherein said preheater comprises at least one infrared heating element for preheating the substrate and the electronic components to a predetermined temperature.

10. The apparatus as claimed in claim 8, wherein said cooling assembly comprises a plurality of infrared heating elements arranged within said housing and adapted to apply infrared heat over the substrate.

11. The apparatus as claimed in claim 8, wherein said molten solder station comprises a molten solder bath for containing a supply of molten solder that is applied to selected areas of the substrate.

12. The apparatus as claimed in claim 11, wherein said molten solder station further comprises at least one nozzle for applying molten solder to selected areas of the substrate.

13. The apparatus as claimed in claim 11, wherein said molten solder station further comprises a narrow nozzle for producing a turbulent wave of molten solder and a wide nozzle for producing a turbulent free wave of molten solder.

14. A reflow solder oven for soldering electronic components to a substrate, said reflow solder oven comprising:

a conveyor for transporting the substrate along a predetermined path;

a preheat zone for heating the substrate to which a solder paste is applied, the solder paste containing solder particles having a solidus temperature;

a reflow zone for melting the solder particles in the solder paste, said reflow zone being located adjacent to and downstream of preheat zone; and a cool down zone comprising a pair of top and bottom heater assemblies operable to direct heated air over the substrate, said cool down zone being located adjacent to and downstream of said reflow zone, wherein said cool down zone is operable to cool the melted solder particles at a rate of less than or equal to approximately 1.0° C. per second until the melted solder particles reach the solidus temperature.

* * * * *